United States Patent
Horn et al.

(10) Patent No.: US 9,537,285 B2
(45) Date of Patent: Jan. 3, 2017

(54) LASER DIODE APPARATUS

(71) Applicant: OSRAM OPTO SEMICONDUCTORS GMBH, Regensburg (DE)

(72) Inventors: Markus Horn, Straubing (DE); Andreas Rozynski, Regensburg (DE); Karsten Auen, Regensburg (DE); Stephan Haneder, Regensburg (DE); Thomas Dobbertin, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/787,680

(22) PCT Filed: Apr. 25, 2014

(86) PCT No.: PCT/EP2014/058483
§ 371 (c)(1),
(2) Date: Oct. 28, 2015

(87) PCT Pub. No.: WO2014/180682
PCT Pub. Date: Nov. 13, 2014

(65) Prior Publication Data
US 2016/0087399 A1     Mar. 24, 2016

(30) Foreign Application Priority Data
May 7, 2013   (DE) .................. 10 2013 104 728

(51) Int. Cl.
*H01S 5/022*     (2006.01)
*H01S 5/024*     (2006.01)
(Continued)

(52) U.S. Cl.
CPC ......... *H01S 5/02292* (2013.01); *H01S 5/0222* (2013.01); *H01S 5/02212* (2013.01);
(Continued)

(58) Field of Classification Search
CPC  H01S 5/02292; H01S 5/02212; H01S 5/0222; H01S 5/02236; H01S 5/02248; H01S 5/02476; H01S 5/4025; H01S 5/4087
See application file for complete search history.

(56) References Cited

U.S. PATENT DOCUMENTS 6,211,511 B1 *  4/2001  Shih ...................... G11B 7/127
                                                                  250/214 R
6,501,781 B1   12/2002  Maurer
(Continued)

FOREIGN PATENT DOCUMENTS

DE         19838518        3/2000
DE     10 2004 012014      10/2005
(Continued)

*Primary Examiner* — Armando Rodriguez
(74) *Attorney, Agent, or Firm* — Cozen O'Connor

(57) ABSTRACT

Laser diode apparatus, comprising a carrier (1) having a carrier top (11), a laser diode chip (4) arranged on the carrier top (11) emitting, during operation, electromagnetic radiation through a radiating face (5), which radiating face (5) runs perpendicularly to the carrier top (11), and at least one optical element (6) to deflect at least some of the electromagnetic radiation radiated by the laser diode chip (4) perpendicularly to the carrier top (11). By the use of a plurality of laser diode chips having wavelengths that differ very slightly from one another, speckles can be reduced. By means of a retarder plate (8) between the laser diode chip and the optical element it is possible to influence the polarization. A polarization cube enables the deflected light beam bundles to fully cover one another as differently polarized light beam bundles.

17 Claims, 8 Drawing Sheets

(51) Int. Cl.
  *H01S 5/323* (2006.01)
  *H01S 5/40* (2006.01)
(52) U.S. Cl.
  CPC ...... *H01S 5/02236* (2013.01); *H01S 5/02248* (2013.01); *H01S 5/02476* (2013.01); *H01S 5/32341* (2013.01); *H01S 5/4025* (2013.01); *H01S 5/4087* (2013.01)

(56) References Cited

U.S. PATENT DOCUMENTS

| | | | |
|---|---|---|---|
| 6,810,057 B1 | 10/2004 | Itoh et al. | |
| 7,394,841 B1 | 7/2008 | Konttinen et al. | |
| 2003/0179680 A1* | 9/2003 | Park | G11B 7/0903 369/112.04 |
| 2007/0091945 A1 | 4/2007 | Ferstl | |
| 2008/0013584 A1 | 1/2008 | Freund | |
| 2009/0016390 A1 | 1/2009 | Sumiyama et al. | |
| 2010/0246159 A1* | 9/2010 | Wada | F21K 9/00 362/84 |
| 2011/0280266 A1* | 11/2011 | Hayashi | H01S 5/02216 372/43.01 |
| 2012/0039072 A1 | 2/2012 | Lell | |
| 2013/0039374 A1 | 2/2013 | Lutgen | |
| 2013/0265770 A1 | 10/2013 | Breidenassel | |
| 2016/0087399 A1 | 3/2016 | Horn | |

FOREIGN PATENT DOCUMENTS

| | | |
|---|---|---|
| DE | 10 2008 063634 | 6/2010 |
| DE | 102008063634 | 6/2010 |
| DE | 10 2010 012604 | 9/2011 |
| DE | 10 2012 103257 | 10/2013 |
| DE | 10 2012 205513 | 10/2013 |
| DE | 10 2013 104728 | 11/2014 |
| EP | 1 744 415 | 1/2007 |
| EP | 1744415 | 1/2007 |
| JP | H09-120568 | 5/1997 |
| JP | H09120568 | 5/1997 |
| JP | H1139693 | 2/1999 |
| JP | H11161993 | 6/1999 |
| JP | 2008-028391 | 2/2008 |
| WO | WO 2011-117185 | 9/2011 |
| WO | WO 2011/117185 | 9/2011 |
| WO | WO 2013/156444 | 10/2013 |
| WO | WO 2013-156444 | 10/2013 |

* cited by examiner

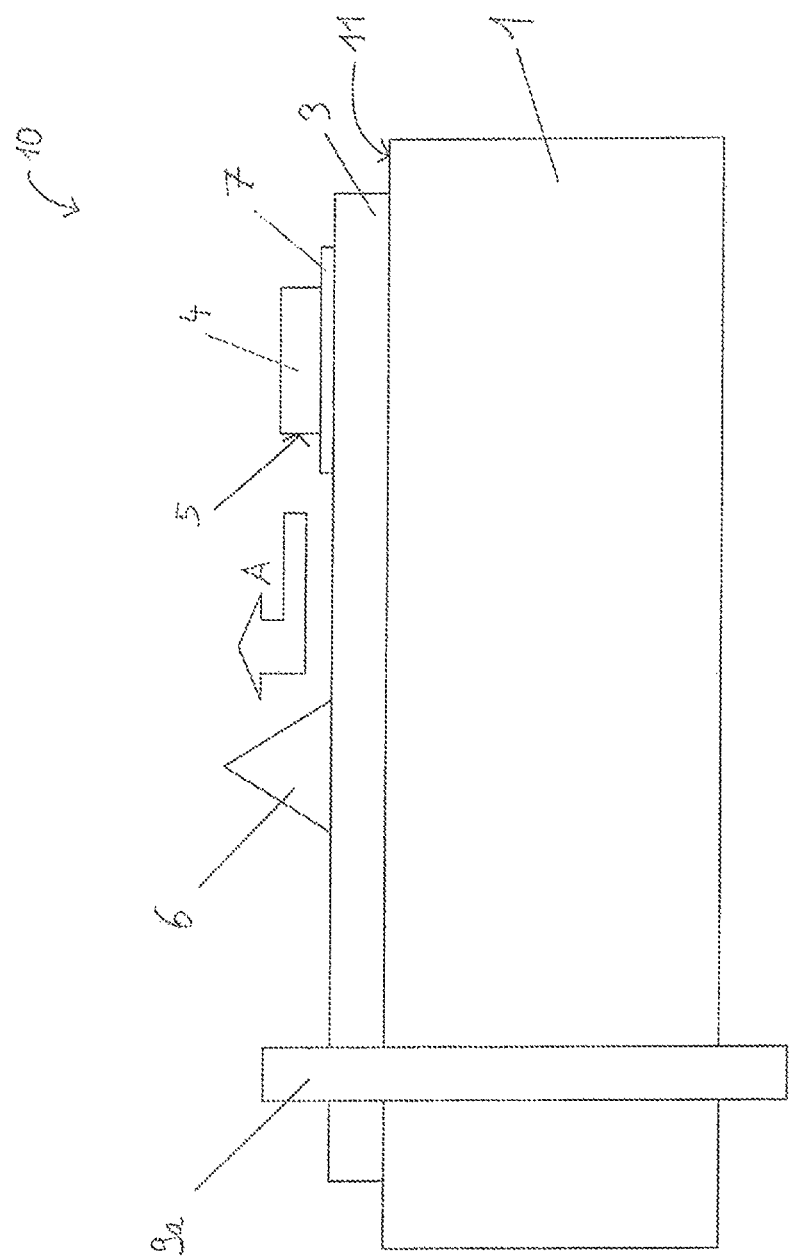

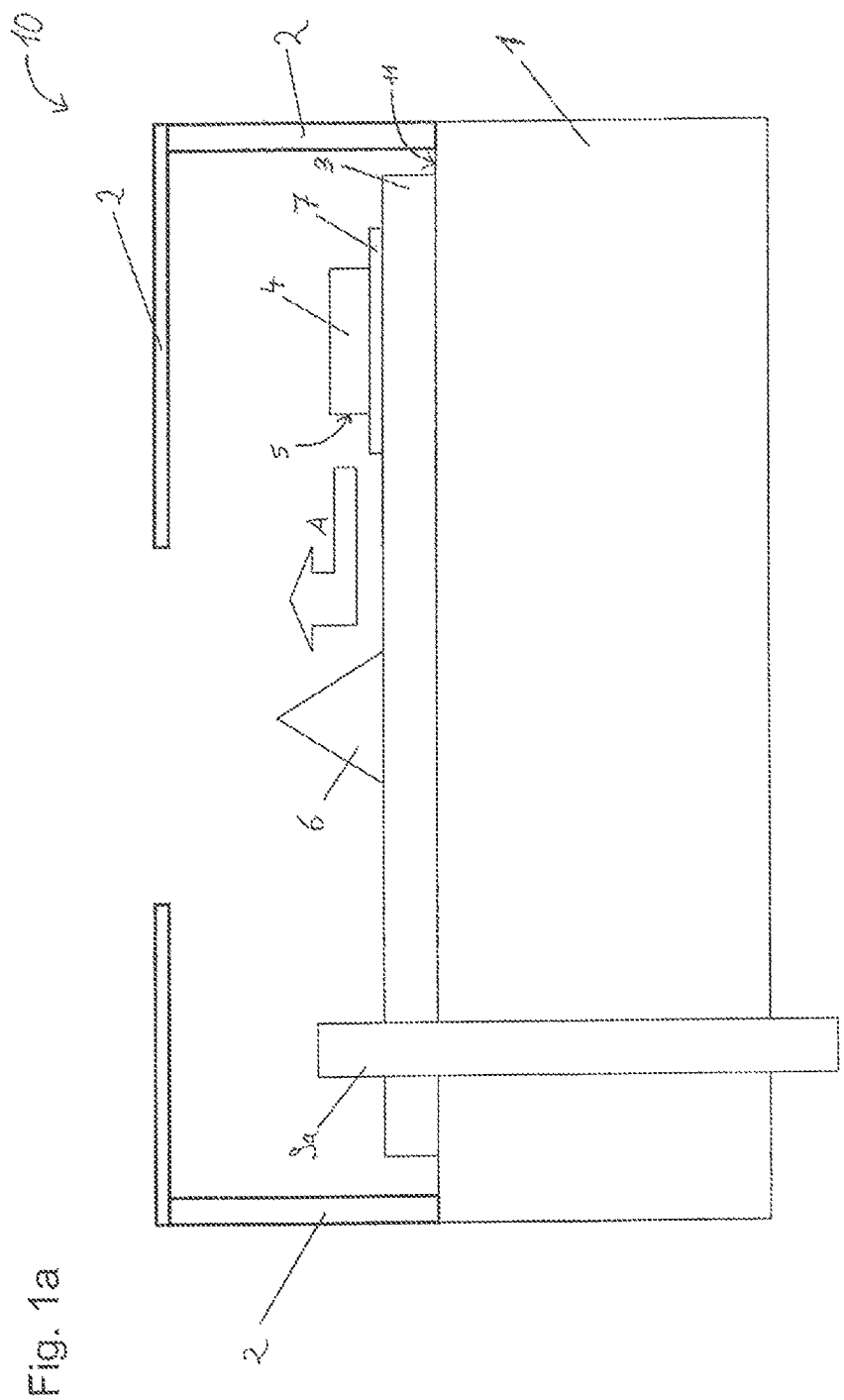

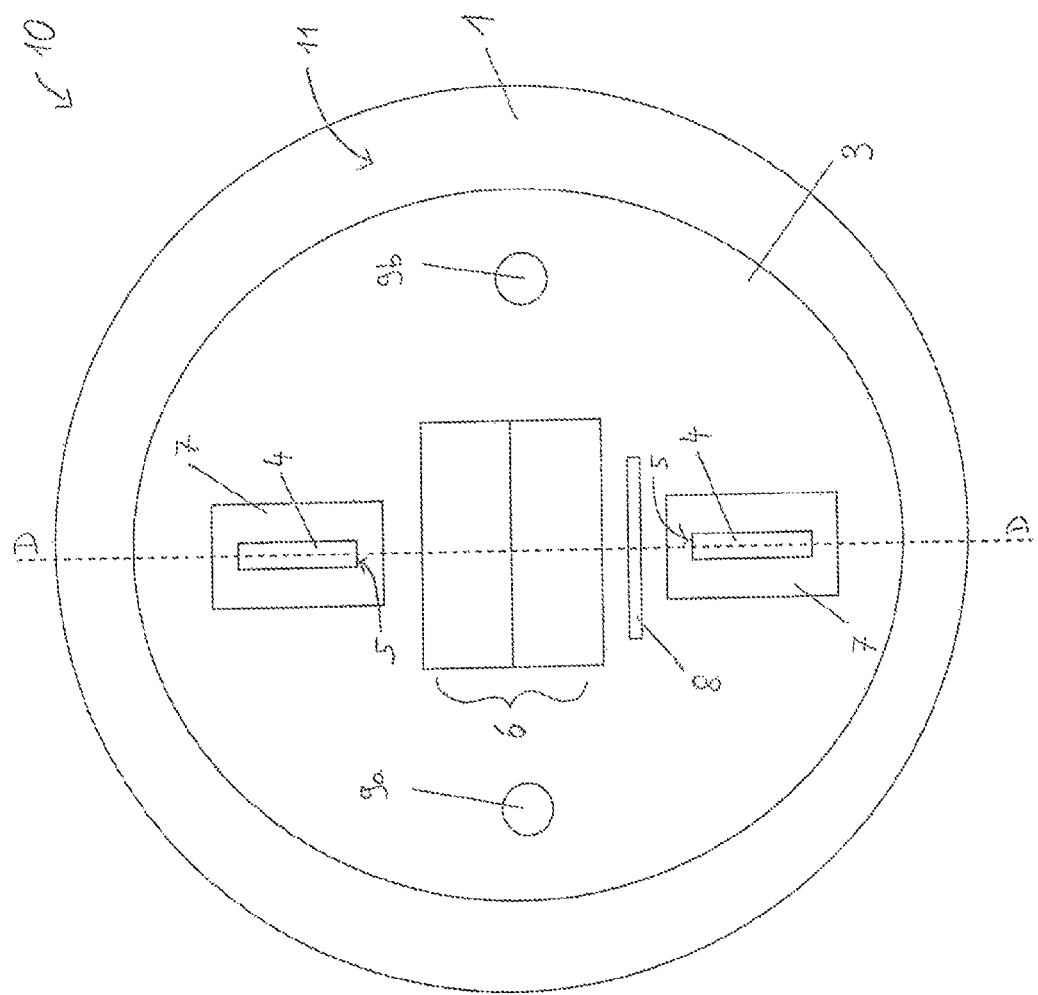

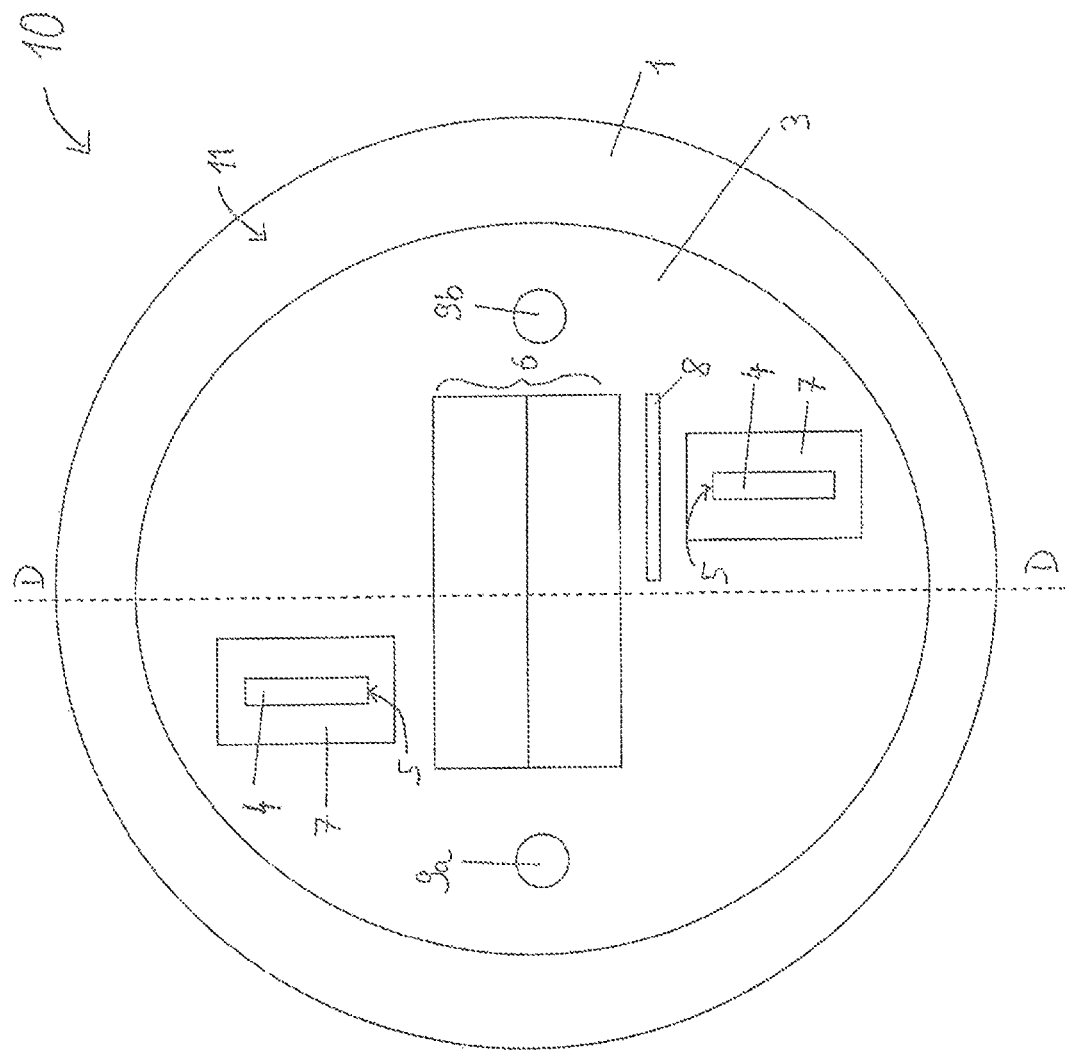

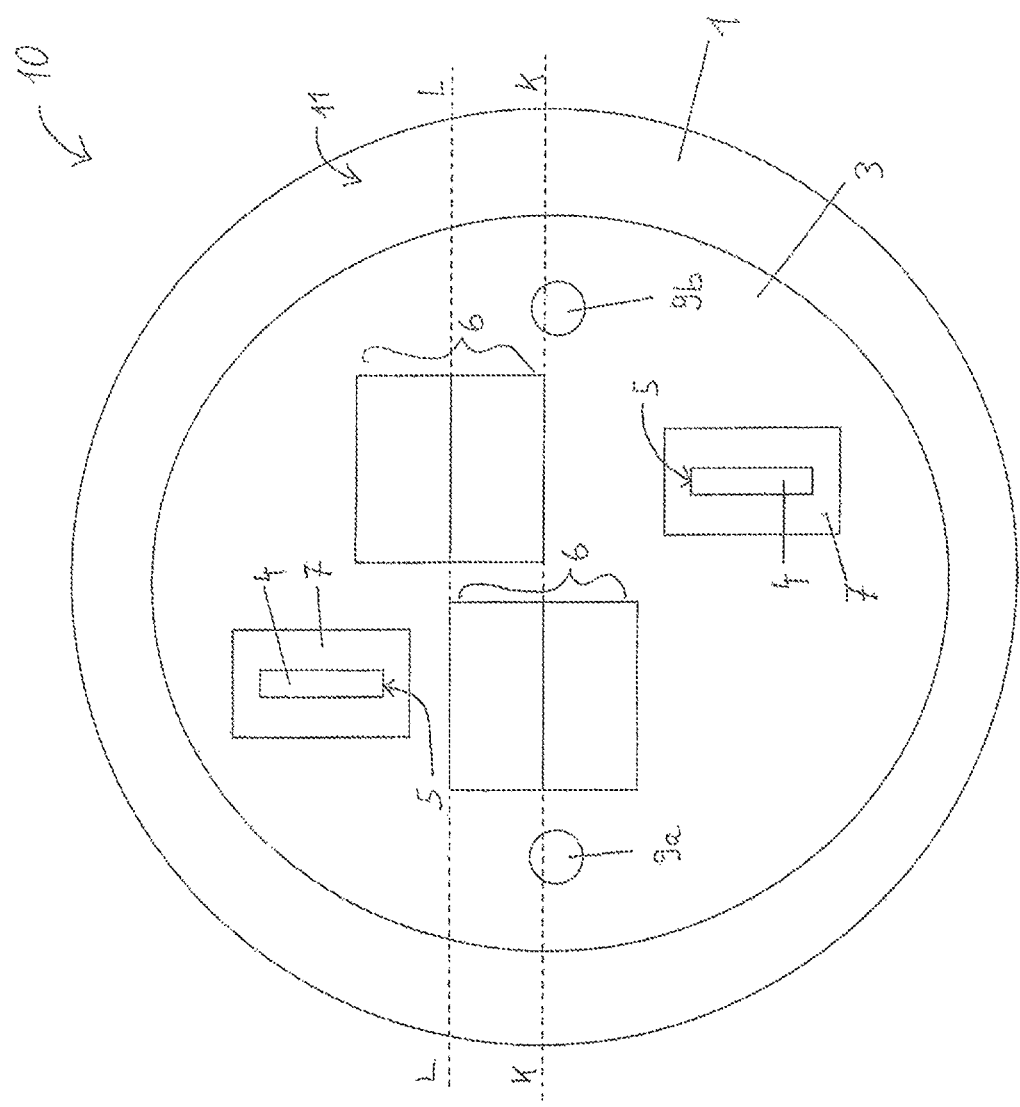

LASER DIODE APPARATUS

RELATED APPLICATIONS

This is a U.S. National stage of International application No. PCT/EP2014/058483 filed on Apr. 25, 2014

This patent application claims the priority of German application no. 10 2013 104 728.9 filed May 7, 2013 the disclosure content of which is hereby incorporated by reference.

FIELD OF THE INVENTION

The invention relates to a laser diode apparatus.

BACKGROUND OF THE INVENTION

Semiconductor lasers are highly sensitive to temperature and exhibit an associated impairment of their efficiency, resulting in a limitation of the maximum achievable optical radiation power.

SUMMARY OF THE INVENTION

One object of the invention is to provide a laser diode apparatus having efficient distribution of heat in the device and enhanced optical radiation power.

In accordance with one configuration, the laser diode apparatus comprises a carrier having a carrier top.

In accordance with at least one embodiment, the laser diode apparatus comprises in particular at least one laser diode chip which is advantageously arranged on the carrier top, the laser diode chip emitting, during operation, electromagnetic radiation through a radiating face. The laser diode chip can be arranged directly on the carrier top or can be arranged on the carrier top by means of a mounting plate. Preferably the radiating face runs perpendicularly to the carrier top. The radiating face is, for example, a side face of the laser diode chip. Accordingly, the laser diode chip emits the radiation preferably in a radiating direction which runs parallel to the main plane of the carrier top.

The radiating face is that face of the laser diode chip through which at least a majority of the radiation emitted during operation of the laser diode chip leaves the laser diode chip. The laser diode chip is then in particular an edge-emitting laser diode chip.

In accordance with at least one embodiment of the laser diode apparatus, the laser diode chip is configured in particular for emitting, during operation, electromagnetic radiation in the spectral range between UV radiation and infrared radiation. For example, the laser diode chip can be configured for emitting UV radiation, blue light, green light, red light or infrared radiation during operation. In particular, the laser diode chip is a laser diode chip based on a nitride compound semiconductor material.

Based on nitride compound semiconductor material means in the present context that a semiconductor layer sequence of the laser diode chip or at least a portion thereof, especially preferably at least an active zone and/or a growth substrate wafer, comprises or consists of a nitride compound semiconductor material, preferably $Al_nGa_mIn_{1-n-m}N$, where $0 \leq n \leq 1$, $0 \leq m \leq 1$ and $n+m \leq 1$. That material need not necessarily have a mathematically exact composition in accordance with the above formula. Rather it may comprise, for example, one or more dopants and also additional constituents. For the sake of simplicity, however, the above formula includes only the basic constituents of the crystal lattice (Al, Ga, In, N), although they can to some extent be supplemented and/or replaced by small amounts of other substances.

The laser diode chip can have in particular an epitaxially grown semiconductor layer sequence which comprises an active layer formed, for example, on the basis of AlGaInN and/or InGaN. The active layer is then configured for emitting, during operation, electromagnetic radiation from the spectral range from ultraviolet radiation to green light. The laser diode chip can have as active layer, for example, a conventional pn-junction, a double heterostructure or a quantum well structure, especially preferably a multiple quantum well structure. The term quantum well structure does not have any significance here in respect of the dimensionality of the quantisation. It therefore encompasses inter alia quantum troughs, quantum wires and quantum dots and any combination of those structures.

The laser diode chip is distinguished in particular by a high optical output power. For example, the optical output power of the laser diode chip is at least 0.1 W.

In accordance with at least one embodiment, the laser diode apparatus comprises at least one optical element by means of which the electromagnetic radiation radiated by the laser diode chip is deflected at least partly perpendicularly to the carrier top.

By means of the optical element, advantageously at least some of the electromagnetic radiation from the laser diode apparatus emitted through the radiating face of the laser diode chip is deflected by means of optical refraction and/or reflection. After striking the optical element, the emitted electromagnetic radiation is advantageously deflected at an angle of preferably 90° with respect to the carrier top. Furthermore, by means of the optical element it is possible to influence in particular the form and direction of the radiated light beam.

In accordance with at least one embodiment, the laser diode apparatus advantageously comprises a mounting plate which is advantageously arranged on the carrier top and covers at least a portion thereof, the mounting plate being located between the at least one laser diode chip and the carrier.

The mounting plate is preferably arranged on the carrier top in such a way that a main plane of the mounting plate runs parallel to the carrier top. Preferably the mounting plate has a flat surface, allowing an advantageously flat arrangement of components of the laser diode apparatus on the mounting plate.

The laser diode chip is preferably arranged with its largest outer face on the mounting plate. Accordingly, the laser diode chip advantageously is in contact with the mounting plate over the largest possible area, with the result that the dissipation of heat from the laser diode chip to the mounting plate is increased. Such an arrangement enables heat to be dissipated directly from the laser diode chip to the mounting plate. Accordingly, very good thermal linkage between the laser diode chip and the mounting plate and the carrier is effected. By means of the advantageously achieved increased efficiency in transporting heat away from the laser diode chip a plurality of laser diode chips is enabled to be used in the device, without giving rise to any appreciable coupling effects between the laser diode chips. Furthermore, the laser diode chip is thereby aligned in such a way that a radiating direction of the electromagnetic radiation runs parallel to the main plane of the mounting plate, with the result that the radiating face of the laser diode chip is perpendicular to the mounting plate.

Furthermore, the mounting plate is advantageously distinguished by high thermal conductivity, resulting in an efficient distribution of heat in the mounting plate.

Accordingly, the high thermal conductivity of the mounting plate advantageously results in increased transport of heat from the laser diode chip, which emits heat during operation, to the carrier.

In accordance with at least one embodiment of the laser diode apparatus, the mounting plate is formed by a Cu plate.

The mounting plate can advantageously have a thickness of from 100 µm to a few mm.

In accordance with at least one embodiment of the laser diode apparatus, the mounting plate preferably has a thickness of at least 0.5 mm and at most 2 mm.

In accordance with at least one embodiment of the laser diode apparatus, the at least one laser diode chip is arranged on a chip carrier.

The chip carrier is preferably in the form of a thin plate having a flat surface and serves as a support structure for the respective laser diode chip during mounting. Advantageously, the chip carrier is made from a material having high thermal conductivity. As a result, efficient transport of heat away from the laser diode chip to the carrier is advantageously further ensured. The chip carrier preferably effects electrical insulation of the laser diode chip from the carrier. For that purpose, the material of the chip carrier is preferably a dielectric material and, in particular, does not comprise any metal. For example, the chip carrier material comprises a ceramic material such as, for example, AlN. Preferably only one laser diode chip is arranged on each chip carrier. The use of chip carriers advantageously enables laser diode chips to be mounted quickly, simply and securely, it is advantageously possible for a plurality of laser diode chips to be arranged on the carrier top and directed towards the optical element.

In accordance with at least one embodiment of the laser diode apparatus, the optical element is a prism. The use of a prism can advantageously be utilised to deflect a light beam by refraction. For example, light beams of a plurality of laser diode chips can advantageously be deflected by one or more prisms in such a way that the light beams run spatially separately from one another or are partially or fully superimposed.

In accordance with at least one embodiment of the laser diode apparatus, the optical element is a mirror. As a possible alternative way of deflecting emitted light beams of the at least one laser diode chip, the use of at least one mirror as optical element advantageously enables the deflected light beams to be aligned by reflection. The mirror is advantageously distinguished by high reflectivity, so that deflection of the laser light by reflection gives rise to virtually no losses.

In accordance with at least one embodiment of the laser diode apparatus, the optical element is a polarisation cube. In order that differently polarised laser light can be diverted from the radiating direction of the laser diode chip and at least partially superimposed, a polarisation cube, for example, is utilised as optical element.

In accordance with at least one embodiment of the laser diode apparatus, at least one retarder plate is arranged between the laser diode chip and the optical element. A retarder plate can advantageously be arranged on the carrier top between a laser diode chip and the optical element. The retarder plate can, for example, also be in the form of a film and advantageously be applied to the optical element. By the use of at least one retarder plate it is advantageously possible to generate differently polarised light by means of identically constructed laser diode chips.

In accordance with at least one embodiment of the laser diode apparatus, the retarder plate is a $\lambda/2$ plate.

In accordance with at least one embodiment of the laser diode apparatus, a plurality of laser diode chips are arranged on the carrier top.

A combination of a plurality of laser diode chips advantageously enables the radiated light intensity to be increased as a result of the emitted light of each individual laser diode chip being deflected by an optical element into a preferably common radiating direction. Advantageously it is possible to use laser diode chips of identical construction. For example, light of the same wavelength from a plurality of laser diode chips can in that way be combined to form a total emission beam of high intensity. As an alternative thereto it is advantageously also possible to position retarder elements, waveplates, wave films or conversion elements between the respective laser diode chips and the optical element to deflect the emission beam. It is thereby possible advantageously to achieve a superimposition of a plurality of wavelengths.

In accordance with at least one embodiment of the laser diode apparatus, the laser diode chips are directed towards the optical element in such a way that light beam bundles of the laser diode chips deflected by the optical element at least partially overlap.

In accordance with at least one embodiment of the laser diode apparatus, the laser diode chips are directed towards the optical element in such a way that light beam bundles of the laser diode chips deflected by the optical element do not overlap.

In such an arrangement of the laser diode chips, deflection by the optical element results in light beam bundles that are spatially separate from one another. The deflecting faces of the optical element are not directed towards the same radiation point.

In accordance with at least one embodiment of the laser diode apparatus, the laser diode chips have different emission wavelengths.

In addition to the use of retarder plates, to generate different emission wavelengths of the laser diode apparatus it is advantageously also possible for the laser diode chips themselves to emit different wavelengths. This offers, in particular, the possibility of making use of a broad spectrum of wavelengths.

Accordingly, the separate light beam bundles are advantageously each composed of the light of a plurality of laser diode chips. The light beam bundles can at least partly consist of superimposed light of the same wavelength/polarisation or of different wavelengths/polarisation.

In accordance with at least one embodiment of the laser diode apparatus, the emission wavelengths of the laser diode chips differ from one another only by at most 10 nm or at most 15 nm.

The difference in the wavelengths of the individual laser diode chips can advantageously be only very slight. In other words, all the laser diode chips can have wavelengths of an identical colour impression, for example of the colour red. The wavelengths can advantageously differ from one another by only 10 nm or 15 nm. Such a difference in the emission wavelengths of the laser diode chips can advantageously be achieved by different constructions of the laser diode chips, for example by the choice of semiconductor materials.

By means of the superimposition of emission wavelengths of similar colour impression, the bandwidth of the superimposed light can be enlarged and, for example, speckles in the laser light reduced.

Accordingly, it is advantageously possible for a single laser diode apparatus to assume the role of a plurality of light sources.

In accordance with at least one embodiment of the laser diode apparatus, the laser diode apparatus comprises a housing which is a TO housing.

In accordance with at least one embodiment of the laser diode apparatus, the TO housing is tightly closed with respect to the environment and especially hermetically sealed. The housing is advantageously evacuated or filled with an inert gas.

BRIEF DESCRIPTION OF THE DRAWINGS

Further features, configurations and expedient arrangements will be found in the following description of exemplary embodiments in conjunction with the Figures.

FIGS. 1, 1a, 2, 2a, 3, 3a, 3b and 4 each show a laser diode apparatus in accordance with the exemplary embodiments of the invention.

In the Figures, elements that are identical or have identical action are in each case denoted by identical reference symbols. The parts illustrated in the Figures and the relative sizes of the parts to one another should not be regarded as to scale.

DETAILED DESCRIPTION OF THE DRAWINGS

Figure 2:
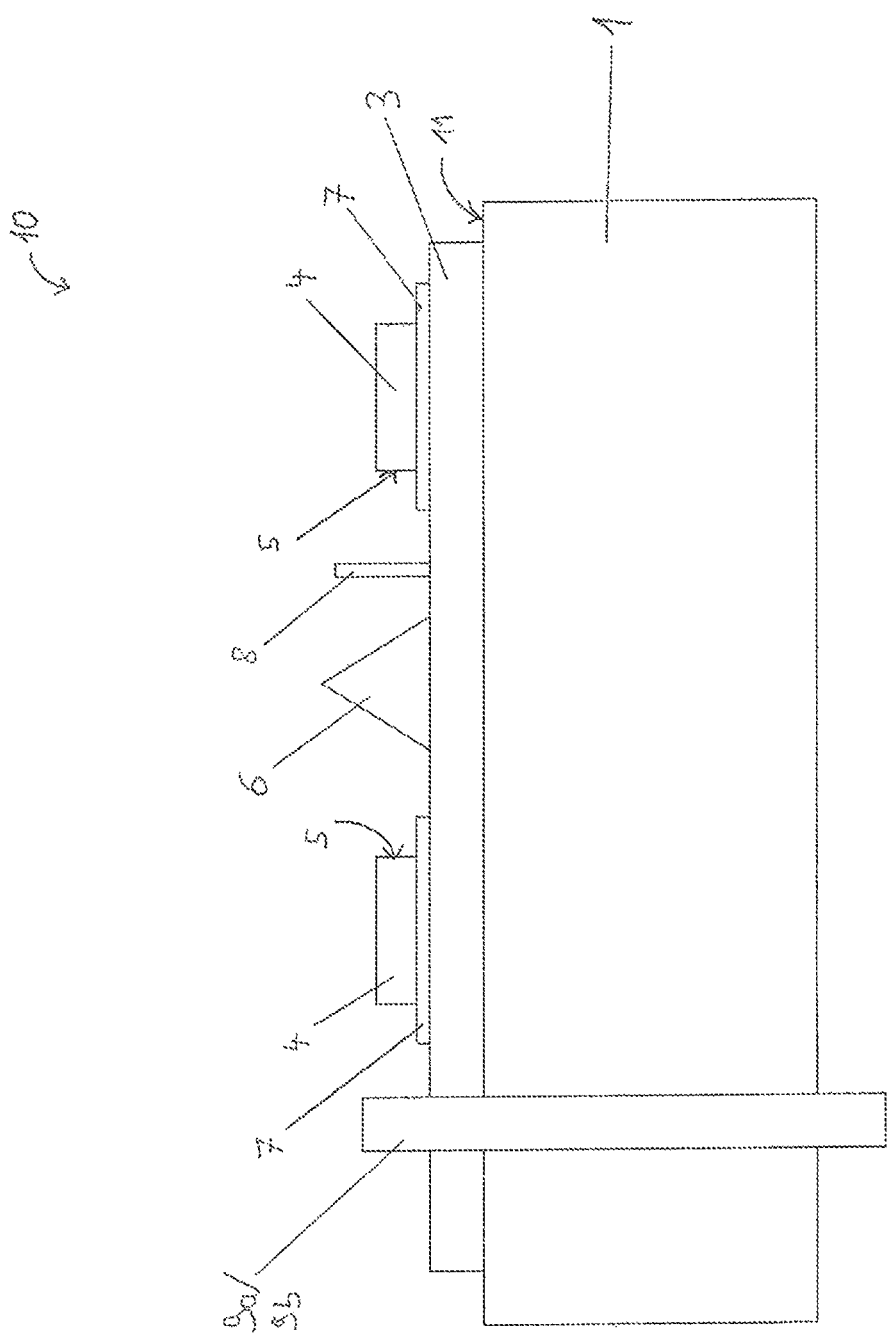

FIG. 1 is a diagrammatic side view of a first exemplary embodiment of a laser diode apparatus 10 described herein.

The laser diode apparatus 10 comprises a carrier 1, which in the present case is made of steel. A mounting plate 3 is affixed to a carrier top 11, the mounting plate 3 covering a portion of the carrier top 11. In the present case the mounting plate 3 is made of copper, so that a high degree of thermal conductivity is provided. Furthermore, in particular two contact rods 9a and 9b, which are electrically insulated from one another and advantageously from the carrier 1 and from the mounting plate 3, pass through the carrier 1 and the mounting plate 3, the contact rods concealing one another in the diagrammatic side view in FIG. 1 and therefore only contact rod 9a being shown in FIG. 1. The position of both contact rods 9a and 9b is shown by way of example in a plan view onto the mounting plate 3 in FIG. 3.

The laser diode apparatus 10 has a laser diode chip 4 which is in particular an InGaN laser formed from epitaxially grown semiconductor layers. It is advantageously an edge emitter which, during operation, emits electromagnetic radiation through a radiating face 5, which radiating face 5 is a side face of the laser diode chip 4. In the present exemplary embodiment, the laser diode chip 4 emits electromagnetic radiation parallel to a main plane of the mounting plate 3.

The construction of the laser diode chip 4 is such that it is mounted by means of a longitudinal side on a chip carrier 7, that longitudinal side advantageously forming the largest surface of the laser diode chip 4. Furthermore, the radiating face 5 is arranged perpendicularly on the chip carrier 7.

The chip carrier 7 serves especially as a support structure for the laser diode chip 4, insulates the laser diode chip 4 advantageously electrically from the carrier and is made, for example, from AlN. Furthermore, electrical contacting of the laser diode chip 4 can be effected by means of bondwire connections from the contact rods 9a and 9b, but this is not shown in FIG. 1. The construction of the chip carrier 7 from AlN is distinguished by high thermal conductivity and accordingly effective thermal linkage of the laser diode chip 4 to the mounting plate 3. Accordingly, during operation, efficient dissipation of heat from the laser diode chip 4 to the mounting plate 3 and further distribution of heat in the mounting plate 3 are achieved, with heat being further dissipated from the mounting plate 3 into the carrier 1.

On the mounting plate 3 there is arranged an optical element 6 which in particular comprises a prism. The prism advantageously serves for deflecting the electromagnetic radiation emitted by the laser diode chip 4 by means of refraction. The deflection is preferably effected in a direction A away from the mounting plate 3 and the carrier top 11.

FIG. 1a shows a diagrammatic sectional view of the exemplary embodiment of FIG. 1, wherein a housing 2 is mounted on the carrier 1. The housing 2 advantageously has an opening in the radiating direction above the optical element 6.

In conjunction with FIG. 2 there is shown, with reference to a diagrammatic sectional view, an exemplary embodiment in which, unlike the exemplary embodiment of FIG. 1, two laser diode chips 4 and a retarder plate 8 are arranged on the mounting plate 3. The laser diode chips 4 can advantageously be of identical construction and emit electromagnetic radiation of the same wavelength or alternatively can be of different construction and have different emission wavelengths. Advantageously each of the two laser diode chips 4 is mounted with its own chip carrier 7 on the mounting plate 3 and emits radiation through the radiating face 5 in the direction of the optical element 6. The optical element 6 can advantageously be a prism which is preferably irradiated axially symmetrically in respect of its centre axis by two oppositely located laser diode chips 4, a retarder plate 8 being mounted on the mounting plate 3 between one laser diode chip 4 and the prism. As an alternative thereto the optical element 6 can also comprise two mirrors, the two mirror faces respectively replacing the two deflecting faces of the prism. The retarder plate 8 is in particular a λ/2 plate which is positioned in front of the laser diode chip 4 in such a way that the retarder plate 8 captures all the radiation emitted by the one laser diode chip 4. The deflection of the radiation of the laser diode chips into the direction away from the carrier top 11 can advantageously result in at least partial superimposition or in spatially separated radiation of the two deflected laser beam bundles of different wavelengths and polarisation.

Figure 2A:
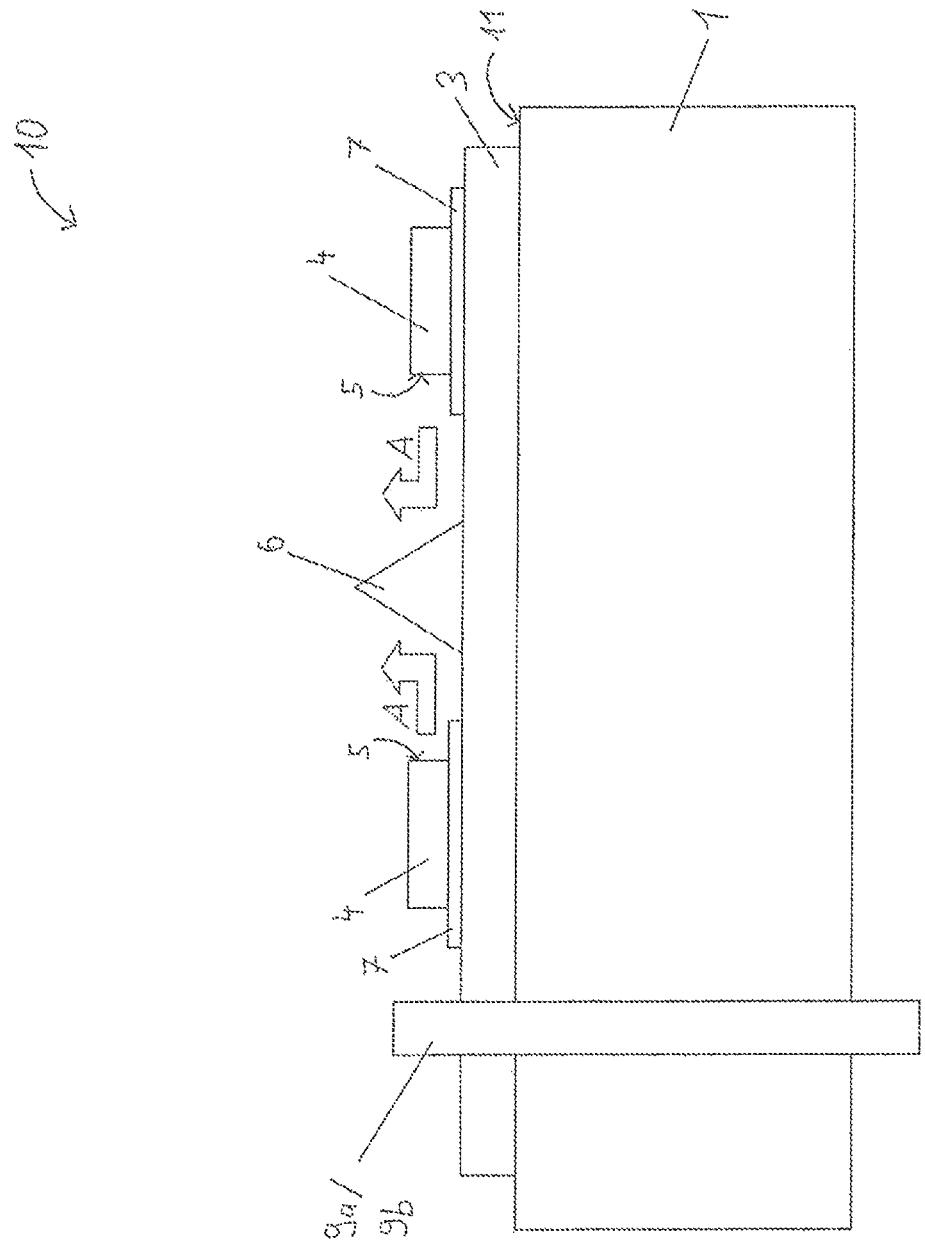

FIG. 2a shows a diagrammatic sectional view of an exemplary embodiment which differs from the exemplary embodiment of FIG. 2 in that there is no retarder element 8 arranged between one of the two laser diode chips 4 and the optical element 6. The optical element 6, which in the present case is a prism, deflects the light beam bundles of the two laser diode chips 4 into a radiating direction A. The two laser diode chips 4 can advantageously have their radiating faces 5 directed towards the optical element 6 so that the deflected light beam bundles at least partially superimpose one another or run spatially separately from one another. A possible at least partial superposition of the deflected light beam bundles of the same emission wavelength results advantageously in an amplification of the radiated optical power of the laser diode apparatus 10. As an alternative thereto it is possible for two light beam bundles of different wavelengths to be at least partially superimposed or to be radiated spatially separately from one another. A difference in the wavelengths of the individual laser diode chips can advantageously be only very slight. In other words, all the laser diode chips can have wavelengths of an identical colour impression, for example of the colour red. The wavelengths can advantageously differ from one another by only at most 10 nm or at most 15 nm. Such a difference in the emission wavelengths of the laser diode chips can advantageously be achieved by different constructions of the laser diode chips, for example by the choice of semiconductor materials.

By means of the superimposition of emission wavelengths of similar colour impression, the bandwidth of the superimposed light can be enlarged and, for example, speckles in the laser light reduced.

The exemplary embodiment of FIG. 3 shows a laser diode apparatus 10 in accordance with the exemplary embodiment of FIG. 2 in a plan view in the direction against the emission direction A. The mounting plate 3 covers at least a portion of the carrier top 11. The two laser diode chips 4 are mounted on their respective chip carriers 7 and are advantageously arranged opposite one another in respect of the centre axis of the optical element 6 on a connecting line D. An exact opposite arrangement of the laser diode chips 4 on an axis D results in at least partial superimposition of the light beam bundles after deflection of the light beam bundles by an optical element 6. In the present case a retarder plate 8 is positioned on the mounting plate 3 between one of the laser diode chips 4 and the optical element 6. As an alternative to the present use of a prism it is advantageously possible also to use a polarisation cube as optical element 6. A polarisation cube makes it possible for the deflected light beam bundles to fully cover one another as differently polarised light beam bundles.

The electrical contacting of the laser diode chips 4 is advantageously achieved by means of two contact rods 9a and 9b. In the present case both contact rods 9a and 9b pass through the carrier 1 and the mounting plate 3 preferably spaced apart laterally from the optical element 6 and located opposite one another in respect of the axis D, the contact rods being electrically insulated from the carrier 1 and the mounting plate 3. Furthermore, contacting with the contact rods 9a and 9b and the laser diode chips 4 and the chip carriers 7 can preferably be effected by means of bondwire connections.

Figure 3A:
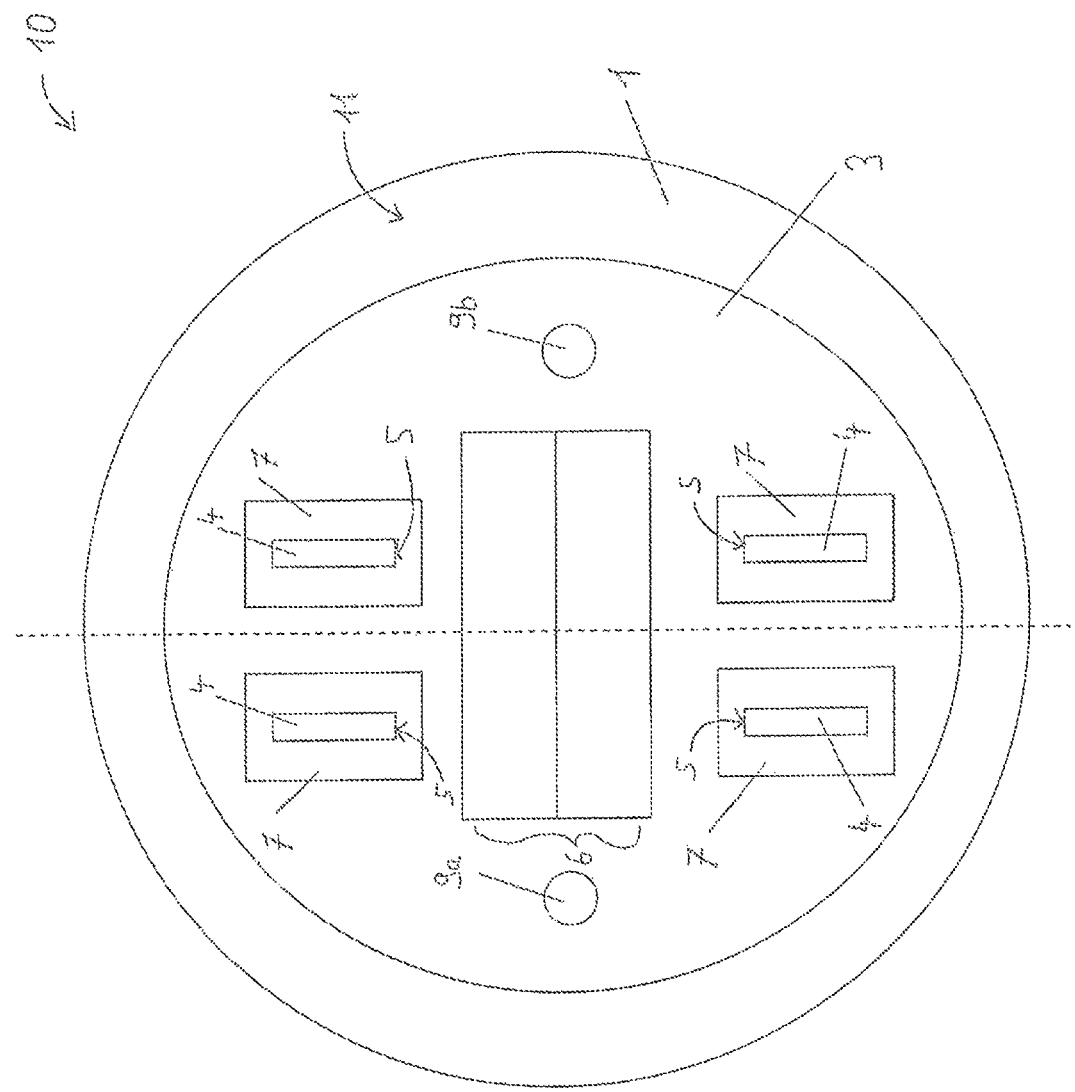

FIG. 3a shows a plan view of an exemplary embodiment of a laser diode apparatus 10 which differs from FIG. 3 in the number of laser diode chips 4 and chip carriers 7. In this case four laser diode chips 4 on four chip carriers 7 have their radiating faces 5 directed towards an optical element 6, preferably a prism. A retarder plate 8 is not included in the exemplary embodiment of FIG. 3a. The four laser diode chips can be of identical construction and have identical emission wavelengths or can be of different construction and have different emission wavelengths.

As a result of the effective dissipation of heat from the laser diode chips 4 and the distribution of heat in the mounting plate 3, the laser diode chips are not subject to any coupling effects or impairments caused by excessive heat. Depending upon the alignment of the optical element it is accordingly possible for the deflected light beam bundles of the individual laser diode chips to be at least partially superimposed or to be radiated spatially separately.

FIG. 3b shows a plan view of an exemplary embodiment in accordance with a modification of the laser diode apparatus 10 according to FIG. 3, wherein the two laser diode chips 4 on their chip carriers 7 are located on opposite sides in respect of the optical element 6, but are advantageously not directly opposite one another and accordingly are not located on the connecting axis D. Deflection of the light beam bundles by a prism therefore results in two light beam bundles spatially separated from one another.

FIG. 4 shows a plan view of an exemplary embodiment in accordance with a further modification of the laser diode apparatus 10 according to FIG. 3, wherein two optical elements 6 are arranged on the mounting plate 3. Preferably the two optical elements are two prisms or mirrors. Preferably the front faces of the optical elements, which deflect the radiation emitted by the laser diode chips 4, are for both optical elements located in parallel one next to the other and are aligned with the respective laser diode chip, accordingly they lie between the boundary lines K and L. Furthermore, both front faces of the optical elements are preferably set at the same angle relative to the mounting plate. The resulting deflection of the emitted radiation of the laser diode chips 4 gives two light beam bundles which are spatially separate and in parallel one next to the other.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:
1. A laser diode apparatus, comprising:
    a carrier having a carrier top;
    a plurality of laser diode chips arranged on the carrier top, the laser diode chips emitting, during operation, electromagnetic radiation through a radiating face, which radiating face runs perpendicularly to the carrier top; and
    at least one optical element by means of which at least some of the electromagnetic radiation radiated by the laser diode chips is deflected perpendicularly to the carrier top,
    wherein the laser diode chips have different emission wavelengths and the emission wavelengths of the laser diode chips differ from one another by at most 15 nm.
2. The laser diode apparatus according to claim 1, comprising a mounting plate which is arranged on the carrier top and covers at least a portion thereof, the mounting plate being located between the at least one laser diode chip and the carrier.
3. The laser diode apparatus according to claim 2, wherein the mounting plate is formed by a copper plate.
4. The laser diode apparatus according to claim 2, wherein the mounting plate has a thickness of at least 0.5 mm and at most 2 mm.
5. The laser diode apparatus according to claim 1, wherein the plurality of laser diode chips is arranged on a chip carrier.
6. The laser diode apparatus according to claim 1, wherein the optical element is a prism.
7. The laser diode apparatus according to claim 1, wherein the optical element is a mirror.
8. The laser diode apparatus according to claim 1, wherein the optical element is a polarisation cube.
9. The laser diode apparatus according to claim 1, wherein at least one retarder plate is arranged between the laser diode chip and the optical element.
10. The laser diode apparatus according to claim 9, wherein the retarder plate is a $\lambda/2$ plate.
11. The laser diode apparatus according to claim 1, wherein the laser diode chips are directed towards the optical element in such a way that light beam bundles of the laser diode chips deflected by the optical element at least partially overlap.

12. The laser diode apparatus according to claim 1, wherein the laser diode chips are directed towards the optical element in such a way that light beam bundles of the laser diode chips deflected by the optical element do not overlap.

13. The laser diode apparatus according to claim 1, wherein the laser diode apparatus comprises a housing which is a TO housing.

14. The diode apparatus according to claim 13, wherein the housing is hermetically sealed with respect to the environment and is evacuated or filled with a protective gas.

15. A laser diode apparatus, comprising:
a carrier having a carrier top;
a plurality of laser diode chips are arranged on the carrier top, the laser diode chips emitting, during operation, electromagnetic radiation through a radiating face, which radiating face runs perpendicularly to the carrier top; and
at least one optical element by means of which at least some of the electromagnetic radiation radiated by the laser diode chips is deflected perpendicularly to the carrier top, wherein the laser diode chips have different emission wavelengths and the emission wavelengths of the laser diode chips differ from one another by at most 15 nm,
wherein all the laser diode chips have wavelengths of an identical color impression, and wherein wavelengths of identical color impression are superimposed by deflection.

16. The laser diode apparatus according to claim 1, wherein the emission wavelengths of the laser diode chips differ from one another by at most 10 nm.

17. The laser diode apparatus according to claim 15, wherein the emission wavelengths of the laser diode chips differ from one another by at most 10 nm.

* * * * *